US011047047B2

(12) United States Patent
Yamada et al.

(10) Patent No.: US 11,047,047 B2
(45) Date of Patent: Jun. 29, 2021

(54) SHOWER HEAD, VAPOR PHASE GROWTH APPARATUS, AND VAPOR PHASE GROWTH METHOD

(71) Applicant: NuFlare Technology, Inc., Kanagawa (JP)

(72) Inventors: Takumi Yamada, Yokohama (JP); Yuusuke Sato, Tokyo (JP); Hideshi Takahashi, Yokohama (JP)

(73) Assignee: NuFlare Technology, Inc., Kanagawa (JP)

( * ) Notice: Subject to any disclaimer, the term of this patent is extended or adjusted under 35 U.S.C. 154(b) by 19 days.

(21) Appl. No.: 16/728,626

(22) Filed: Dec. 27, 2019

(65) Prior Publication Data

US 2020/0131639 A1    Apr. 30, 2020

Related U.S. Application Data

(63) Continuation of application No. 16/505,056, filed on Jul. 8, 2019, now Pat. No. 10,550,473, which is a (Continued)

(30) Foreign Application Priority Data

Nov. 5, 2015  (JP) ................................. 2015-217593

(51) Int. Cl.
*C23C 16/455* (2006.01)
*C23C 16/06* (2006.01)
*C23C 16/52* (2006.01)

(52) U.S. Cl.
CPC ........ *C23C 16/45565* (2013.01); *C23C 16/06* (2013.01); *C23C 16/45512* (2013.01); *C23C 16/45572* (2013.01); *C23C 16/52* (2013.01)

(58) Field of Classification Search
CPC .............. C23C 16/45565; C23C 16/52; C23C 16/45512; C23C 16/06; C23C 16/45572
(Continued)

(56) References Cited

U.S. PATENT DOCUMENTS 5,002,631 A * 3/1991 Giapis ............... H01J 37/32935
216/60
5,935,337 A * 8/1999 Takeuchi .......... C23C 16/45565
118/724
(Continued)

FOREIGN PATENT DOCUMENTS

JP    61-248519 A    11/1986
JP    05-190464       7/1993
(Continued)

OTHER PUBLICATIONS

Japanese Office Action (JPOA) dated Jul. 23, 2019 issued in Japanese Patent Application No. 2015-217593 and its English translation.

*Primary Examiner* — Rudy Zervigon
(74) *Attorney, Agent, or Firm* — Rankin, Hill & Clark LLP

(57) ABSTRACT

A shower head according to an embodiment includes: a mixing chamber mixing a plurality of process gases; a shower plate provided below the mixing chamber, the shower plate including a plurality of longitudinal flow paths and a lateral cooling flow path provided between the longitudinal flow paths, a mixed gas of the process gases flowing through the longitudinal flow paths, a cooling medium flowing through the lateral cooling flow path; and an outer circumferential portion cooling flow path provided around the shower plate.

11 Claims, 12 Drawing Sheets

Related U.S. Application Data continuation of application No. 15/340,606, filed on Nov. 1, 2016, now Pat. No. 10,407,772.

(58) Field of Classification Search
USPC .............................. 118/663, 666, 715, 724; 156/345.24–345.28, 345.33, 345.34
See application file for complete search history.

(56) References Cited

U.S. PATENT DOCUMENTS

| | | | | |
|---|---|---|---|---|
| 5,950,925 | A * | 9/1999 | Fukunaga | C23C 16/45512 239/132.3 |
| 6,117,245 | A | 9/2000 | Mandrekar et al. | |
| 6,132,512 | A * | 10/2000 | Horie | C23C 16/45565 118/715 |
| 6,433,314 | B1 | 8/2002 | Mandrekar et al. | |
| 6,453,992 | B1 * | 9/2002 | Kim | C23C 16/45565 118/666 |
| 8,083,855 | B2 * | 12/2011 | Dhindsa | H01J 37/32724 118/724 |
| 8,114,245 | B2 * | 2/2012 | Ohmi | H01J 37/32623 156/345.43 |
| 8,216,486 | B2 * | 7/2012 | Dhindsa | G05D 23/22 216/67 |
| 8,313,610 | B2 * | 11/2012 | Dhindsa | H01J 37/32091 156/345.27 |
| 8,375,890 | B2 * | 2/2013 | Kiehlbauch | H01J 37/32091 118/723 E |
| 8,535,445 | B2 * | 9/2013 | Volf | H01L 21/68764 118/725 |
| 8,910,591 | B2 * | 12/2014 | Kiehlbauch | H01J 37/32724 118/723 E |
| 8,968,512 | B2 * | 3/2015 | Nishimoto | H01J 37/32192 156/345.27 |
| 10,407,772 | B2 * | 9/2019 | Yamada | C23C 16/52 |
| 10,550,473 | B2 * | 2/2020 | Yamada | C23C 16/45565 |
| 2003/0121609 | A1 * | 7/2003 | Ohmi | H01J 37/32623 156/345.47 |
| 2008/0236495 | A1 | 10/2008 | Tompa | |
| 2010/0021631 | A1 | 1/2010 | Moriyama et al. | |
| 2010/0124610 | A1 * | 5/2010 | Aikawa | C23C 16/4584 427/255.28 |
| 2010/0139762 | A1 | 6/2010 | Ohmi et al. | |
| 2011/0253044 | A1 * | 10/2011 | Tam | B05B 1/18 118/666 |
| 2012/0064698 | A1 * | 3/2012 | Olgado | C23C 16/45574 438/478 |
| 2012/0304926 | A1 * | 12/2012 | Boguslavskiy | C23C 16/4584 118/696 |
| 2013/0109159 | A1 * | 5/2013 | Carlson | C23C 16/45574 438/503 |
| 2014/0118751 | A1 | 5/2014 | Rajagopalan et al. | |

FOREIGN PATENT DOCUMENTS

| | | |
|---|---|---|
| JP | 09-002896 A2 | 1/1997 |
| JP | 09-87090 | 3/1997 |
| JP | 2002-510876 A | 4/2002 |
| JP | 5231117 | 7/2013 |
| WO | 2008146575 A1 | 12/2008 |

* cited by examiner

SHOWER HEAD, VAPOR PHASE GROWTH APPARATUS, AND VAPOR PHASE GROWTH METHOD

CROSS-REFERENCE TO RELATED APPLICATION

This application is based upon and claims the benefit of priority from Japanese Patent Applications No. 2015-217593, filed on Nov. 5, 2015, the entire contents of which are incorporated herein by reference.

FIELD OF THE INVENTION

The present invention relates to a shower head that supplies process gas, and a vapor phase growth apparatus and a vapor phase growth method using the shower head.

BACKGROUND OF THE INVENTION

As a method for forming a high-quality semiconductor film, there is an epitaxial growth technique that forms a film on a substrate using vapor phase growth. In a vapor phase growth apparatus using the epitaxial growth technique, a substrate is placed on a supporter in the vapor phase growth apparatus which is maintained at normal pressure or reduced pressure. Then, process gas, which is raw material gas, is supplied to the substrate while the substrate is being heated. For example, the thermal reaction of the process gas occurs in the surface of the substrate and an epitaxial single-crystal film is formed on the surface of the substrate.

If the process gas is supplied to the substrate, it is preferable to uniformly supply the process gas onto the substrate, using a shower head. Here, while a film is being formed, the temperature of the shower head increases and the shower head is deformed. Therefore, a process of cooling the shower head is performed.

SUMMARY OF THE INVENTION

A shower head according to an embodiment includes: a mixing chamber mixing a plurality of process gases; a shower plate provided below the mixing chamber, the shower plate including a plurality of longitudinal flow paths and a lateral cooling flow path provided between the longitudinal flow paths, a mixed gas of the process gases flowing through the longitudinal flow paths, a cooling medium flowing through the lateral cooling flow path; and an outer circumferential portion cooling flow path provided around the shower plate.

A vapor phase growth apparatus according to an embodiment includes: a reaction chamber; a supporter provided in the reaction chamber, a substrate being capable of being placed on the supporter; and a shower head provided in an upper part of the reaction chamber, the shower head including a mixing chamber mixing a plurality of process gases, a shower plate provided below the mixing chamber, the shower plate including a plurality of longitudinal flow paths and a lateral cooling flow path provided between the longitudinal flow paths, a mixed gas of the process gases flowing through the longitudinal flow paths, a cooling medium flowing through the lateral cooling flow path, and an outer circumferential portion cooling flow path provided around the shower plate.

A vapor phase growth method according to an embodiment includes: mixing a plurality of process gases; supplying a mixed gas of the process gases to a plurality of longitudinal flow paths provided in a shower plate; controlling a temperature of the shower plate using a lateral cooling flow path provided between the longitudinal flow paths and an outer circumferential portion cooling flow path provided around the shower plate, such that a difference between the temperature of an outermost circumferential portion and the temperature of a central portion of the shower plate is equal to or less than 5° C., a cooling medium flowing through the lateral cooling flow path; supplying the process gases from the longitudinal flow paths to a reaction chamber; and growing a film on a substrate put into the reaction chamber using the process gases.

DETAILED DESCRIPTION OF THE EMBODIMENTS

Hereinafter, embodiments of the invention will be described with reference to the drawings.

In the specification, the direction of gravity in a state in which a vapor phase growth apparatus is provided so as to form a film is defined as a "lower" direction and a direction opposite to the direction of gravity is defined as an "upper" direction. Therefore, a "lower portion" or a "lower part" means a position in the direction of gravity relative to the reference and a "lower side" means the direction of gravity relative to the reference. In addition, an "upper portion" or an "upper part" means a position in the direction opposite to the direction of gravity relative to the reference and an "upper side" means the direction opposite to the direction of gravity relative to the reference.

In the specification, "process gas" is a general term of gas used to form a film on a substrate. The concept of the "process gas" includes, for example, raw material gas, source gas, carrier gas, and separation gas.

First Embodiment

A shower head according to this embodiment includes a mixing chamber mixing a plurality of process gases; a shower plate provided below the mixing chamber, the shower plate including a plurality of longitudinal flow paths and a lateral cooling flow path provided between the longitudinal flow paths, a mixed gas of the process gases flowing through the longitudinal flow paths, a cooling medium flowing through the lateral cooling flow path; and an outer circumferential portion cooling flow path provided around the shower plate.

Figure 1:
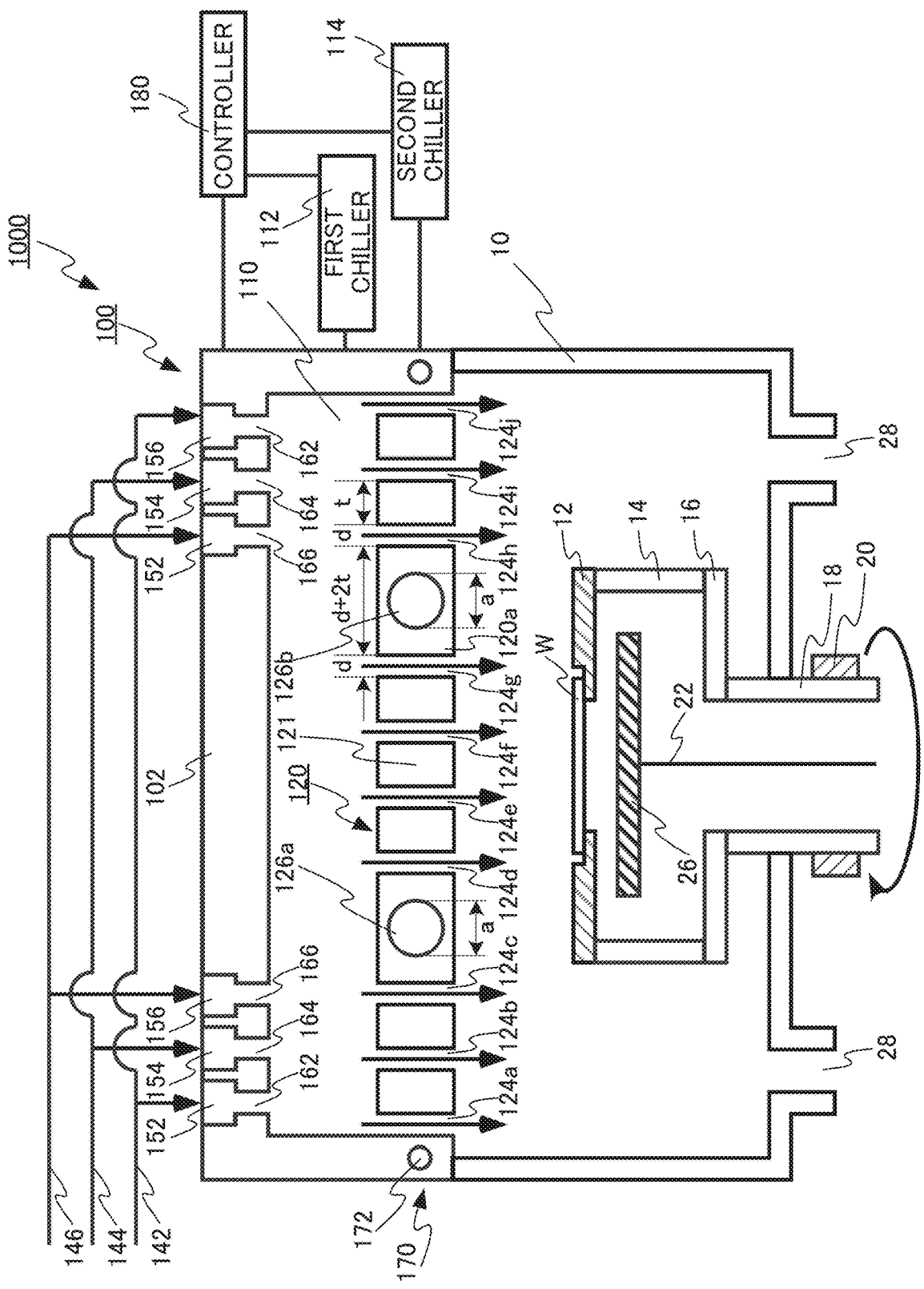
FIG. 1 is a cross-sectional view schematically illustrating a main portion of a vapor phase growth apparatus according to a first embodiment.
Figure 2:
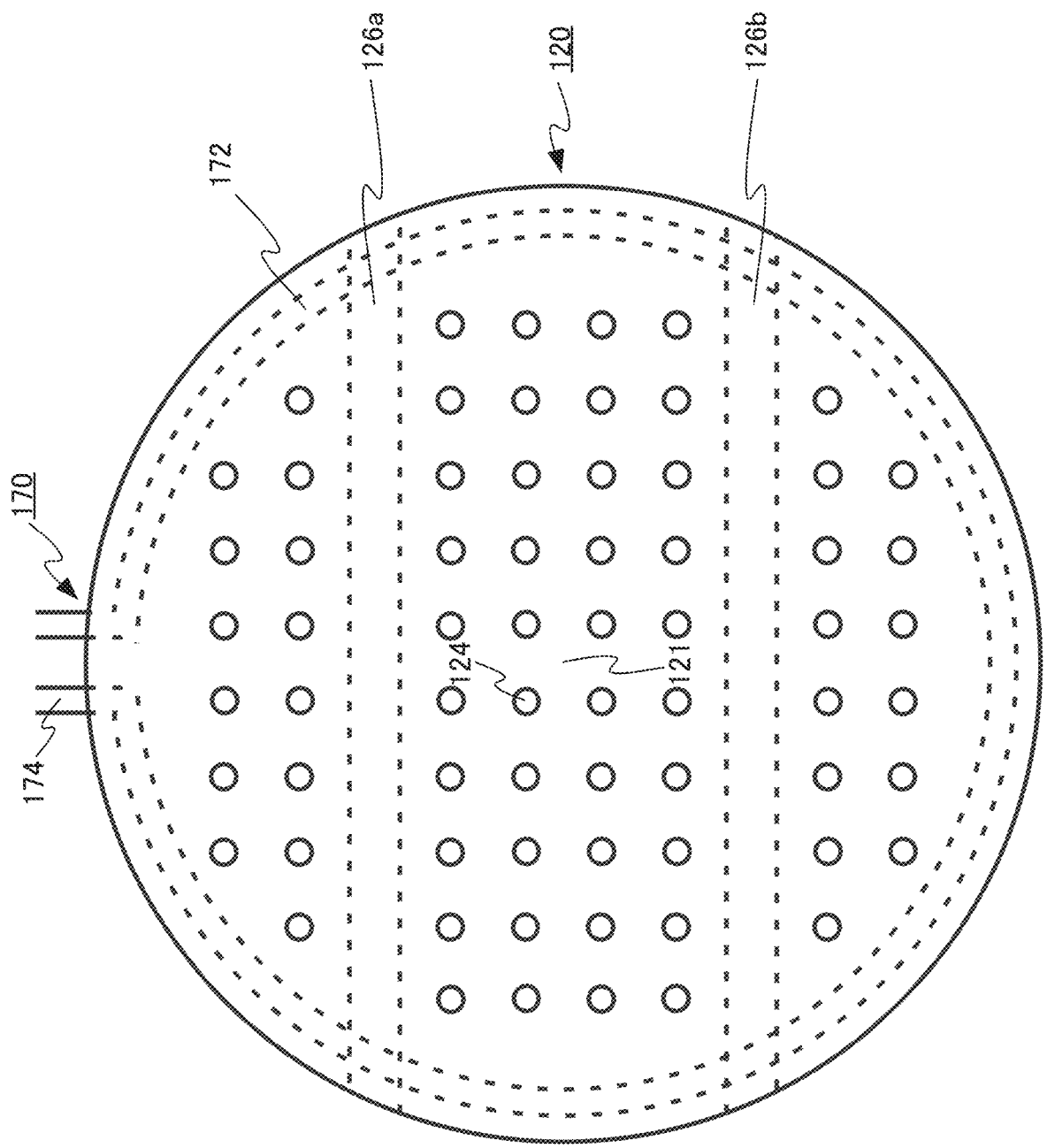
FIG. 2 is a bottom view schematically illustrating a shower plate and an outer circumferential portion cooler of the vapor phase growth apparatus according to the first embodiment.

FIG. 1 is a cross-sectional view schematically illustrating a main portion of the vapor phase growth apparatus according to this embodiment. FIG. 2 is a bottom view schematically illustrating a shower plate and an outer circumferential portion cooler of the vapor phase growth apparatus according to this embodiment.

The vapor phase growth apparatus according to this embodiment is a vertical single-wafer-type epitaxial growth apparatus using a metal organic chemical vapor deposition (MOCVD) method. The epitaxial growth apparatus according to this embodiment forms a group III-V nitride-based semiconductor single-crystal film, such as a gallium nitride (GaN) film, an aluminum nitride (AlN) film, an aluminum gallium nitride (AlGaN) film, or an indium gallium nitride (InGaN) film.

In FIG. 1, a vapor phase growth apparatus 1000 includes a reaction chamber 10. A film is grown in the reaction chamber 10.

The reaction chamber 10 includes a supporter 12 on which a wafer (substrate) W is placed and which rotates the wafer W in a circumferential direction of the wafer W. The wafer W is, for example, a silicon (Si) wafer or a sapphire wafer. For example, a holder which has an opening at the center and supports the substrate on a circumferential edge is used as the supporter 12. However, the supporter 12 may be a susceptor without an opening. In addition, the supporter 12 is provided with, for example, a push-up pin (not illustrated) used to attach or detach the wafer W to or from the supporter 12.

An upper end of a rotating shaft 18 is provided in the reaction chamber 10. The supporter 12 is connected to the upper end of the rotating shaft 18 through a rotating ring 14 and a rotating base 16 provided below the rotating ring 14. The rotating shaft 18 is rotated by a rotating mechanism 20 to rotate the wafer W in the circumferential direction. Here, the rotating mechanism 20 is not particularly limited. For example, a motor is used. The structures of the rotating ring 14, the rotating base 16, and the rotating shaft 18 are not limited thereto.

A heater 26 is supplied with power by, for example, an external power supply (not illustrated) through an electrode 22 that passes through the inside of the rotating shaft 18 and a current introduction terminal (not illustrated) and generates heat.

The reaction container 8 includes a wafer unloading/loading port (not illustrated). The wafer unloading/loading port is used to load the wafer W into a reaction container 8 and to unload the wafer W from the reaction container 8. Here, for example, a robot hand (not illustrated) is used to load and unload the wafer W. The wafer W loaded by the robot hand is supported by the supporter 12 in the reaction container 8. A method for loading and unloading the wafer W is not limited thereto.

The vapor phase growth apparatus 1000 includes a shower head 100 provided above the reaction chamber 10. Here, the shower head 100 includes a top plate 102, a mixing chamber 110, a shower plate 120, and an outer circumferential portion cooler 170.

The top plate 102 is provided above the mixing chamber 110 and includes a first manifold 152, a second manifold 154, a third manifold 156, a first connection flow path 162, a second connection flow path 164, and a third connection flow path 166. A first process gas, a second process gas, and a third process gas are supplied from a first gas supply path 142, a second gas supply path 144, and a third gas supply path 146 to the first manifold 152, the second manifold 154, and the third manifold 156, respectively. Then, the first process gas, the second process gas, and the third process gas are supplied to the mixing chamber 110 through the first connection flow path 162 connected to the first manifold 152, the second connection flow path 164 connected to the second manifold 154, and the third connection flow path 166 connected to the third manifold 156, respectively. The first process gas, the second process gas, and the third process gas are mixed in the mixing chamber 110.

For example, if a GaN single-crystal film is formed on the wafer W by an MOCVD method, hydrogen ($H_2$) is supplied as the first process gas. In addition, ammonia ($NH_3$), which is the source gas of nitrogen (N), is supplied as the second process gas. Furthermore, gas obtained by diluting trimethylgallium (TMG) with $H_2$ is supplied as the third process gas. Here, TMG is the source gas of gallium (Ga), and $H_2$ is the carrier gas.

The shower plate 120 is provided below the mixing chamber 110 and includes a plurality of longitudinal flow paths 124 (124$a$, 124$b$, 124$c$, 124$d$, 124$e$, 124$f$, 124$g$, 124$h$, 124$i$, and 124$j$) and lateral cooling flow paths 126 (126$a$ and 126$b$) provided between the longitudinal flow paths 124$c$ and 124$d$ and between the longitudinal flow paths 124$g$ and 124$h$. A first cooling medium (cooling medium) flows through lateral cooling flow paths 126. Here, the shower plate 120 is made of metal such as aluminum.

The first, second, and third process gases mixed in the mixing chamber 110 flow through the longitudinal flow paths 124. The mixed gas of the first, second, and third process gases is supplied to the reaction chamber 10 and is used to grow a film on the wafer W. The surplus process gas and a by-product are exhausted from the reaction chamber 10 by an exhaust device (not illustrated) through a gas exhaust portion 28 provided in a lower part of the reaction chamber 10. Here, the exhaust device is, for example, a vacuum pump.

For example, the first cooling medium is supplied from a first chiller 112 to the lateral cooling flow paths 126 and cools the shower head 100 (shower plate 120). The first cooling medium may be supplied from the chiller to one (for example, the lateral cooling flow path 126$a$) of the lateral cooling flow paths 126, may be supplied to the other lateral cooling flow path 126 (for example, the lateral cooling flow path 126$b$), and may be returned to the chiller. In addition, the first cooling medium may be supplied from the chiller to a plurality of lateral cooling flow paths (126a and 126b) and may be returned to the chiller, without passing through other lateral cooling flow paths. Here, the first cooling medium is, for example, water. It is preferable that the lateral cooling flow path 126 have a straight shape for ease of manufacture, as illustrated in FIG. 2. However, the lateral cooling flow path 126 may have some bent portions.

It is preferable that the diameter a of the lateral cooling flow path 126, the diameter d of the longitudinal flow path 124, and the gap t between the plurality of longitudinal flow paths 124 satisfy the following relationship in the plane perpendicular to the flow direction of the first cooling medium: $d<t<a<d+2t$. If the gap t between the longitudinal flow paths 124 is equal to or less than the diameter d of the longitudinal flow path 124, the volume of a portion 120a of the shower plate 120 which is adjacent to the longitudinal flow path 124 is reduced and the strength of the shower plate 120 is reduced, which is not preferable. If the diameter a of the lateral cooling flow path 126 is equal to or less than the gap t between the plurality of longitudinal flow paths 124, pressure loss increases and a sufficient amount of first cooling medium does not flow through the lateral cooling flow path 126. Therefore, the shower head 100 (shower plate 120) is not sufficiently cooled. If the diameter a of the lateral cooling flow path 126 is equal to or greater than d+2t, the diameter of the lateral cooling flow path 126 is large and it is difficult to provide many longitudinal flow paths 124. As a result, reaction gas is not uniformly supplied onto the wafer W and the non-uniformity of the thickness or composition of the film formed on the wafer W increases.

It is preferable that the plurality of longitudinal flow paths 124 be disposed at equal intervals in order to uniformly supply the reaction gas onto the wafer W in the plane perpendicular to the flow direction of the first cooling medium. However, the plurality of longitudinal flow paths 124 are not necessarily disposed at equal intervals.

More preferably, the gap between the longitudinal flow path 124g and the longitudinal flow path 124h that are provided adjacent to the lateral cooling flow path 126b is d+2t in the plane perpendicular to the flow direction of the first cooling medium. In other words, the width of the portion 120a of the shower plate which is disposed between the longitudinal flow path 124g and the longitudinal flow path 124h is d+2t in the plane perpendicular to the flow direction of the first cooling medium. That is, another longitudinal flow path 124 can be provided in the portion 120a of the shower plate between the longitudinal flow path 124g and the longitudinal flow path 124h, separating both from the longitudinal flow path 124h and the longitudinal flow path 124i with the gap t. However, in this embodiment, another longitudinal flow path 124 is not provided and the lateral cooling flow path 126 is provided.

Preferably, the cross-sectional shape of the lateral cooling flow path 126 is a circle in the plane perpendicular to the flow direction of the first cooling medium in terms of ease of manufacture of the lateral cooling flow path 126. Preferably, the center of the cross section of the lateral cooling flow path 126 is equidistant from adjacent longitudinal flow paths 124g and 124h in order to uniformly cool the shower head 100 (shower plate 120).

Preferably, the lateral cooling flow path 126 is disposed so as to be away from the center 121 of the shower plate. In other words, preferably, the lateral cooling flow path 126 is not provided at the center 121 of the shower plate. In a single-wafer-type vapor phase growth apparatus, in general, the center of the wafer W is disposed on a line perpendicular to the center of the shower plate 120. In this case, in the structure in which the lateral cooling flow path 126 is disposed so as to be away from the center of the shower plate 120, because as many longitudinal flow paths 124 as possible are provided at the center of the shower plate 120 and the reaction gas is supplied, the distribution of the reaction gas on the wafer W becomes uniform if the wafer W is rotated in the circumferential direction of the wafer W.

It is preferable that a plurality of lateral cooling flow paths 126 be symmetrically provided with respect to the center 121 of the shower plate in order to uniformly cool the shower head 100.

The outer circumferential portion cooler 170 includes an outer circumferential portion cooling flow path 172 and an outer circumferential portion pipe 174. The outer circumferential portion cooling flow path 172 is provided around the shower plate 120. In this embodiment, for example, a second cooling medium is supplied from a second chiller 114 to the outer circumferential portion cooling flow path 172 through the outer circumferential portion pipe 174 to cool the shower head 100 (shower plate 120). Here, the second cooling medium is, for example, water. The outer circumferential portion pipe 174 is disposed on the upper side of the plane of paper in FIG. 2. However, the position where the outer circumferential portion pipe 174 is disposed is not particularly limited. The outer circumferential portion cooler is not limited thereto. For example, a known cooling mechanism, such as a cooling fin provided around the shower plate 120, may be preferably used.

It is preferable that the difference between the temperature of the outermost circumferential portion of the shower plate 120 and the temperature of the center 121 of the shower plate be equal to or less than 5° C. In this case, it is possible to control the thickness or composition of a film formed on the wafer W so as to be uniform, which will be described below. Here, the temperature of the outermost circumferential portion of the shower plate 120 is defined as the temperature of a portion of the shower plate 120 adjacent to a longitudinal flow path 124 which is provided at the outermost circumference of the shower plate 120 among the longitudinal flow paths 124. If the longitudinal flow path 124 is provided at the center 121 of the shower plate, the temperature of a wall surface of the longitudinal flow path 124 is measured and the measured temperature can be used as the temperature of the center 121 of the shower plate. Otherwise, the temperature of a portion of the shower plate 120 adjacent to the longitudinal flow path 124 provided at the center 121 of the shower plate may be measured, and the measured temperature may be used as the temperature of the center 121 of the shower plate. Here, the temperature of the shower plate 120 is preferably measured by, for example, a thermocouple or a radiation thermometer.

A controller 180 is connected to the rotating mechanism 20, the heater 26, the exhaust device, and the outer circumferential portion cooler 170 by wires (not illustrated). In addition, the controller 180 is connected to the first chiller 112 and the second chiller 114. The controller 180 performs an operation of controlling the rotation of the wafer W by the rotating mechanism 20 and the rotation speed of the wafer W, an operation of controlling the heating of the wafer W by the heater 26, an operation of controlling the supply of the process gas from the first gas supply path 142, the second gas supply path 144, and the third gas supply path 146 to the reaction chamber 10, an operation of controlling the transport of the wafer W by the robot hand, an operation of controlling the exhaust of the surplus process gas and a by-product from the gas exhaust portion by the exhaust device, an operation of controlling the temperature of the shower plate 120 using the first chiller 112 and the lateral cooling flow path 126, and an operation of controlling the temperature of the shower plate 120 using the second chiller 114 and the outer circumferential portion cooling flow path 172.

The controller 180 may compose of hardware such as an electrical circuit or a quantum circuit, or may compose of software. If the controller 180 may compose of software, a microprocessor centered on a central processing unit (CPU), a read only memory (ROM) that stores a processing program, a random access memory (RAM) that temporarily stores data, an input/output port, and a communication port may be used. A recording media may not be limited to detachable disks such as magnetic disk or optical disk, and fixed recording media such as hard disk device or memory may also be preferable.

Figure 3:
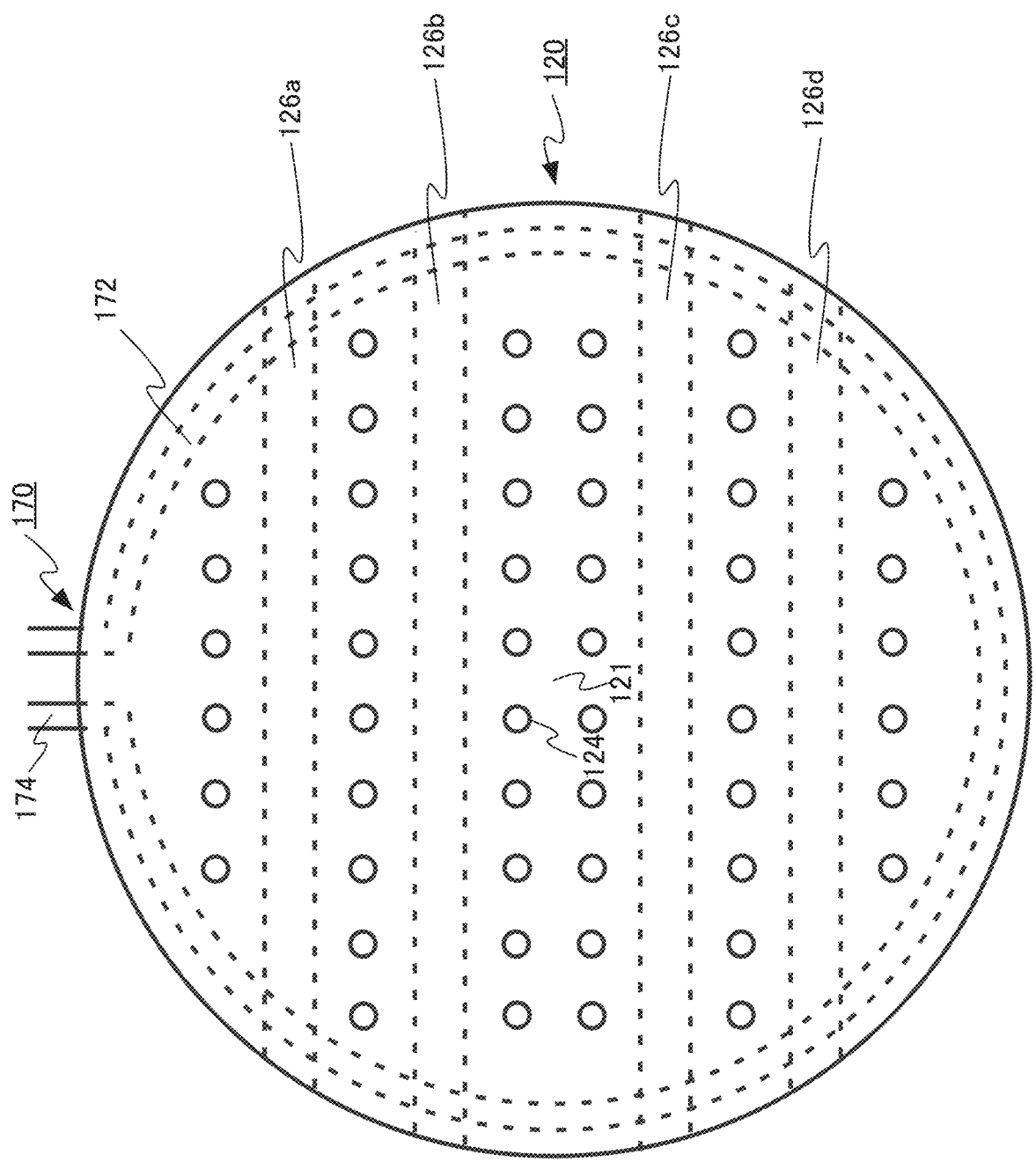
FIG. 3 is a bottom view schematically illustrating a shower plate and an outer circumferential portion cooler of a vapor phase growth apparatus according to another aspect of the first embodiment.

FIG. 3 is a bottom view schematically illustrating a shower plate and an outer circumferential portion cooling flow path of a vapor phase growth apparatus according to another aspect of the first embodiment. The shower head 100 illustrated in FIG. 2 is provided with two lateral cooling flow paths, that is, the lateral cooling flow path 126a and the lateral cooling flow path 126b. However, four cooling flow paths may be symmetrically provided with respect to the center 121 of the shower plate such that two cooling flow paths are disposed on one side of the center 121.

Figure 4:
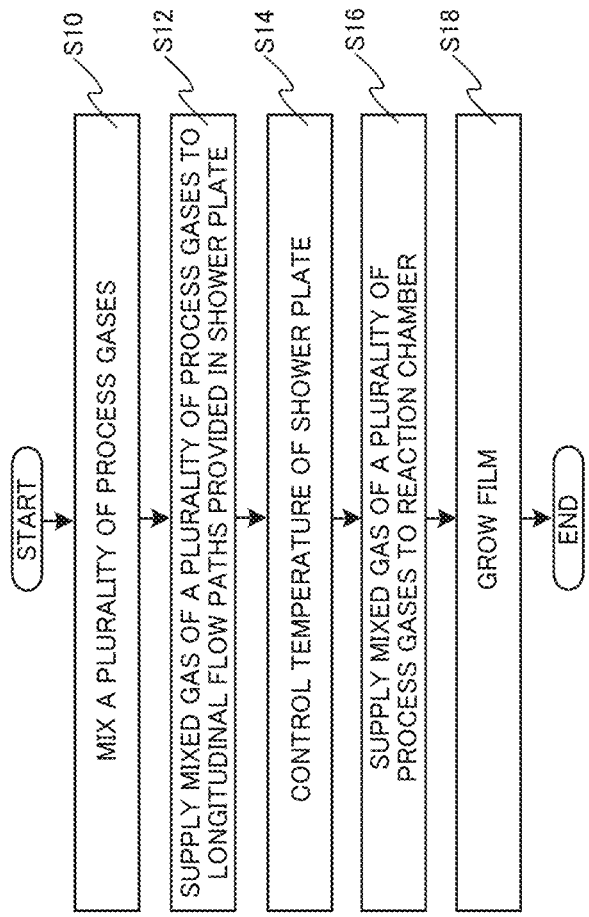
FIG. 4 is a flowchart illustrating a vapor phase growth method according to the first embodiment.

FIG. 4 is a flowchart illustrating a vapor phase growth method according to this embodiment.

First, the controller 180 loads the wafer W into the reaction chamber 10 and places the wafer W on the supporter 12, using, for example, the robot hand. Then, the controller 180 heats the wafer W using the heater 26. Then, the controller 180 rotates the wafer W in the circumferential direction of the wafer W at a predetermined rotation speed, using the rotating mechanism 20.

Then, the controller 180 supplies the first process gas, the second process gas, and the third process gas from the first gas supply path 142, the second gas supply path 144, and the third gas supply path 146 to the mixing chamber 110 and mixes the first process gas, the second process gas, and the third process gas (S10). Among the first process gas, the second process gas, and the third process gas, two types of process gas may be mixed.

Then, the controller 180 supplies the first process gas, the second process gas, and the third process gas mixed in the mixing chamber 110 to the longitudinal flow paths 124 provided in the shower plate 120 (S12).

Then, the controller 180 controls the temperature of the shower plate 120, using the lateral cooling flow paths 126 and the outer circumferential portion cooling flow path 172, such that the difference between the temperature of the outermost circumferential portion and the temperature of the central portion in the shower plate 120 is equal to or less than 5° C. (S14).

Then, the mixed gas of the first process gas, the second process gas, and the third process gas supplied to the longitudinal flow paths 124 is supplied to the reaction chamber 10 (S16).

Then, a film is grown on the wafer W placed on the supporter 12 in the reaction chamber 10, using the first process gas, the second process gas, and the third process gas (S18).

After the growth of the film is completed, the temperature of the wafer W is reduced and the wafer W is unloaded from the reaction container 8, using, for example, the robot hand.

Figure 5A:
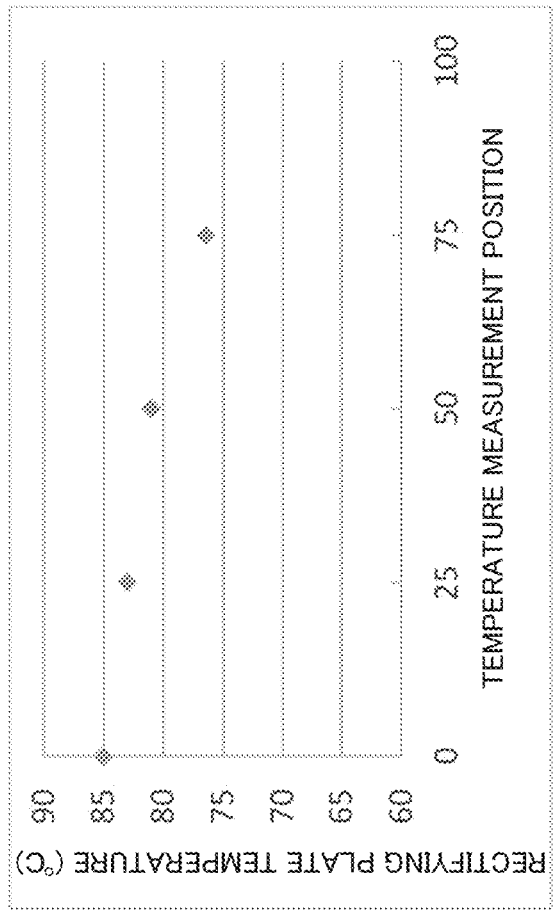
FIGS. 5A and 5B are diagrams illustrating the temperature distribution of a shower plate of the first embodiment.
Figure 5B:
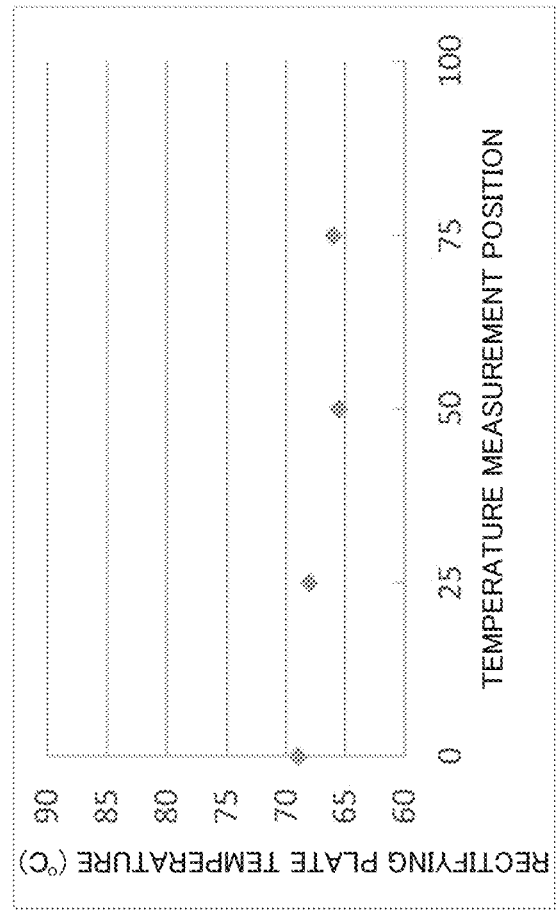

FIGS. 5A and 5B illustrate the temperature distribution of the shower plate 120 in this embodiment. FIG. 5A illustrates the temperature distribution of the shower plate 120 when the shower plate 120 is cooled by the lateral cooling flow path 126, without using the outer circumferential portion cooling flow path 172, and FIG. 5B illustrates the temperature distribution of the shower plate 120 when the shower plate 120 is cooled by both the outer circumferential portion cooling flow path 172 and the lateral cooling flow path 126.

In FIG. 5A, the temperature of a portion of the shower plate 120 (the center 121 of the shower plate) above the center of the wafer W is 85° C. and the temperature of a portion of the shower plate 120 that is 75 mm away from the center of the wafer W is 75° C. Therefore, the difference between the temperature of a portion of the shower plate 120 above the center of the wafer W (the center 121 of the shower plate) and the temperature of a portion of the shower plate 120 that is 75 mm away from the center of the wafer W is 10° C.

On the other hand, in FIG. 5B, the temperature of a portion of the shower plate 120 above the center of the wafer W (the center 121 of the shower plate) is 70° C. and the temperature of a portion of the shower plate 120 that is 75 mm away from the center of the wafer W is 65° C. Therefore, the difference between the temperature of a portion of the shower plate 120 (the center 121 of the shower plate) above the center of the wafer W and the temperature of a portion of the shower plate 120 that is 75 mm away from the center of the wafer W is 5° C.

Figure 6A:
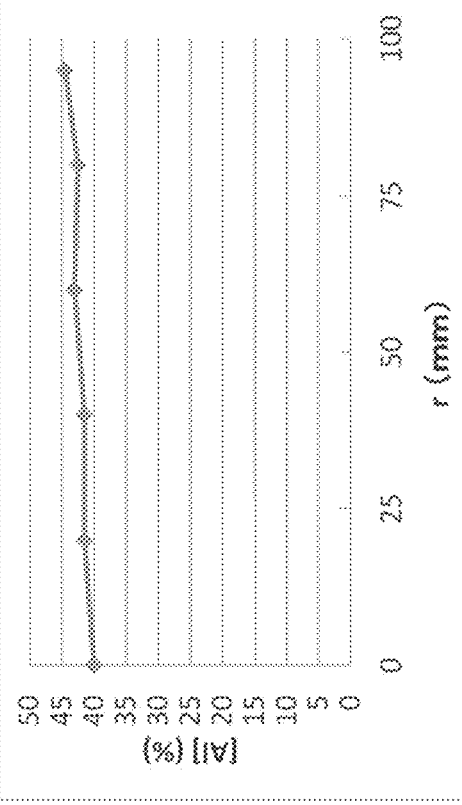
FIGS. 6A to 6D are diagrams illustrating the characteristics of a film formed by the vapor phase growth apparatus according to the first embodiment.
Figure 6B:
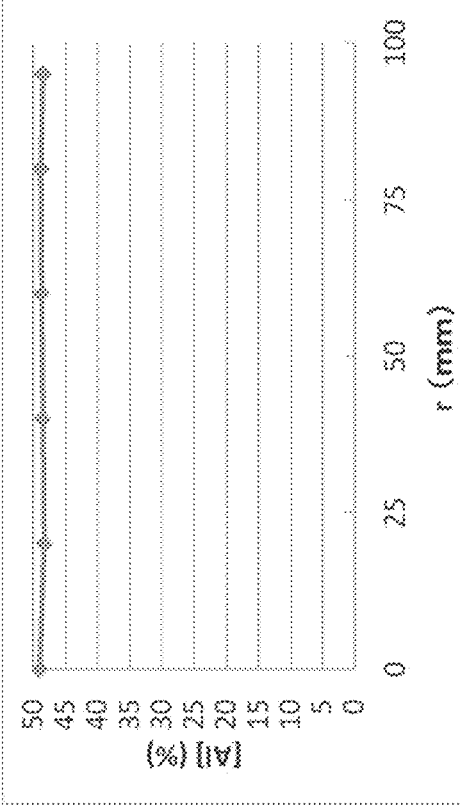
Figure 6C:
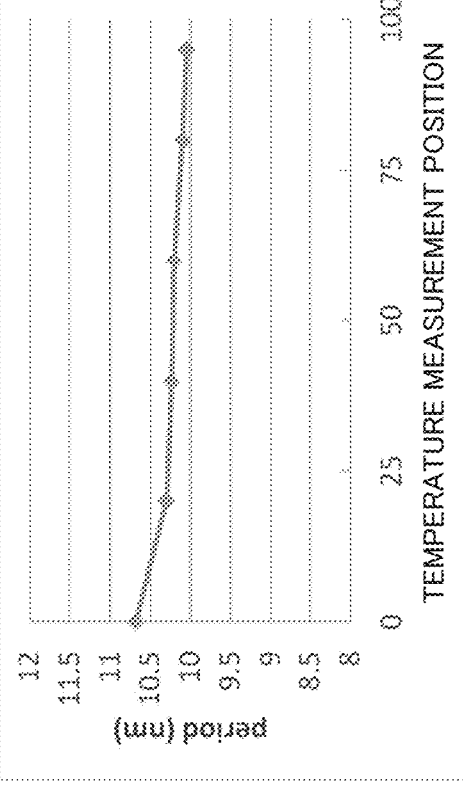
Figure 6D:
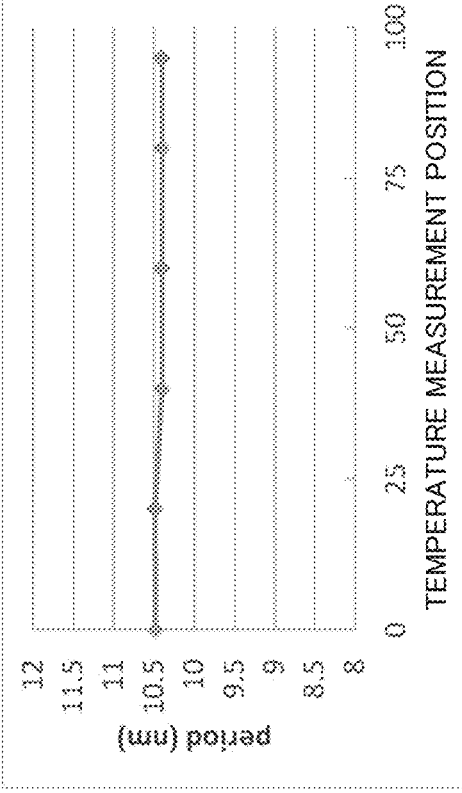

FIGS. 6A to 6D are diagrams illustrating the characteristics of a film formed by the vapor phase growth apparatus according to this embodiment. FIG. 6A illustrates the dependence of the thickness of a film (period), which is formed while the shower plate 120 is cooled by the lateral cooling flow path 126, without using the outer circumferential portion cooling flow path 172, on a position in the plane of the wafer W. FIG. 6B illustrates the dependence of the Al composition distribution of a film, which is formed while the shower plate 120 is cooled by the lateral cooling flow path 126, without using the outer circumferential portion cooling flow path 172, on a position in the plane of the wafer W. FIG. 6C illustrates the dependence of the thickness of a film (period), which is formed while the shower plate 120 is cooled by both the outer circumferential portion cooling flow path 172 and the lateral cooling flow path 126, on a position in the plane of the wafer W. FIG. 6D illustrates the dependence of the Al composition distribution of a film, which is formed while the shower plate 120 is cooled by both the outer circumferential portion cooling flow path 172 and the lateral cooling flow path 126, on a position in the plane of the wafer W.

When cooling is performed by the lateral cooling flow path 126, without using the outer circumferential portion cooling flow path 172, the difference between the thickness of the film on the center of the wafer W and the thickness of the film on a portion of the wafer W that is 75 mm away from the center is ±3%, as illustrated in FIG. 6A. In contrast, when cooling is performed by both the outer circumferential portion cooling flow path 172 and the lateral cooling flow path 126, the difference between the thickness of the film on the center of the wafer W and the thickness of the film on a portion of the wafer W that is 75 mm away from the center is ±1%, as illustrated in FIG. 6C.

In FIG. 6A, the thickness of the film on the center (0 mm) of the wafer W is the largest and the thickness of the film on the periphery of the wafer W is the smallest. The difference between the thickness of the film on the center of the wafer W and the thickness of the film on a portion of the wafer W that is 95 mm away from the center is ±3%. In FIG. 6C, the difference between the thicknesses is reduced to ±1%. In FIG. 6B, the difference between the Al concentrations is ±2%. In FIG. 6D, the difference between the Al concentrations is reduced to ±0.6%. This shows that, when the shower head is uniformly cooled, the characteristics of a formed film, such as the thickness of the film and the element concentration of the film, are improved.

According to the shower head, the vapor phase growth apparatus, and the vapor phase growth method of this embodiment, since the shower head is uniformly cooled, it is possible to form a film with a uniform thickness.

Second Embodiment

A shower head according to this embodiment differs from the shower head according to the first embodiment in that it further includes a first transparent member 128 provided between the longitudinal flow paths, a second transparent member 130 provided in the top plate 102, and a measuring instrument provided on the second transparent member 130. Here, the description of the same components as those in the first embodiment will not be repeated.

Figure 7:
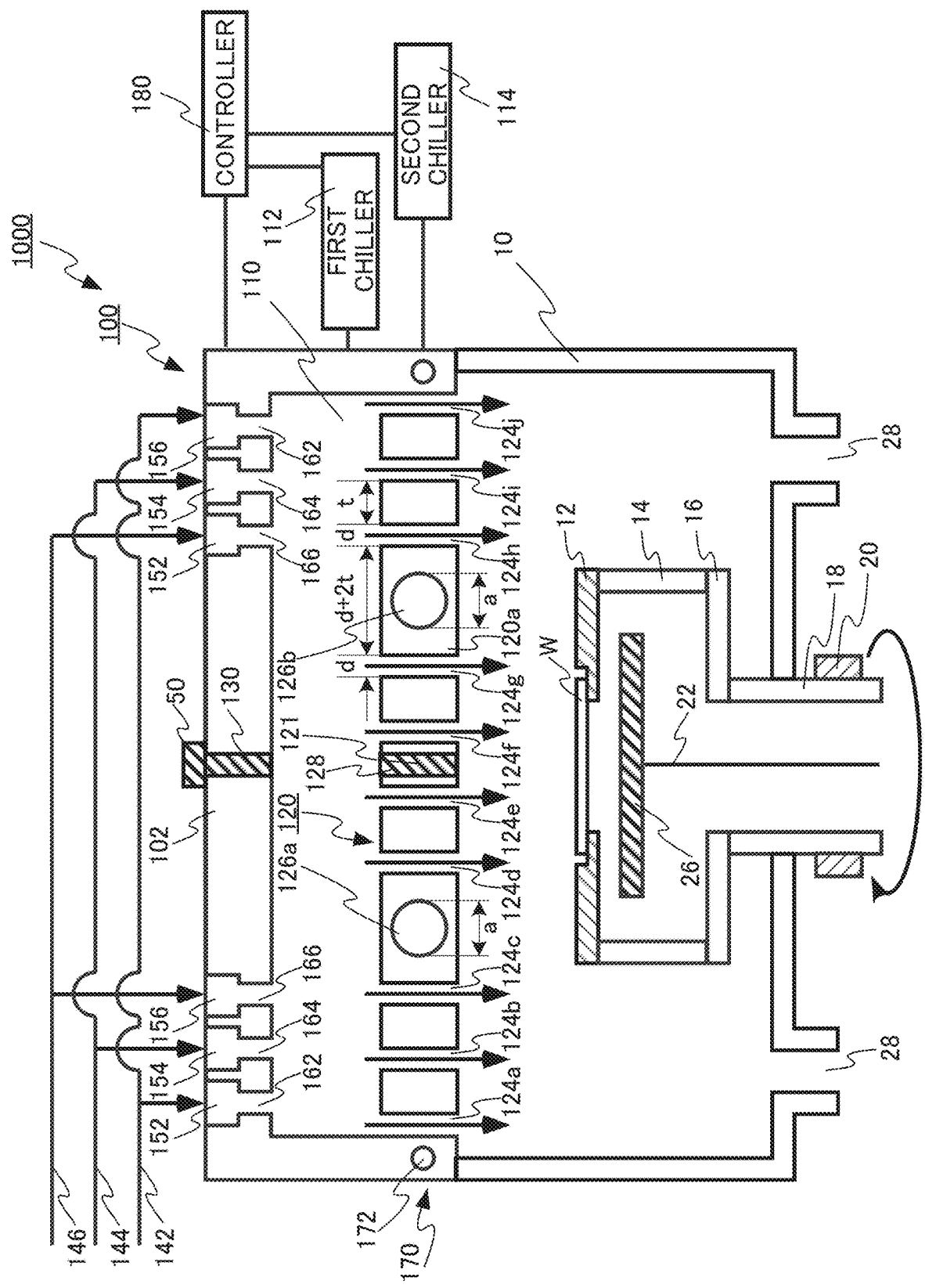
FIG. 7 is a cross-sectional view schematically illustrating a main portion of a vapor phase growth apparatus according to a second embodiment.
Figure 8:
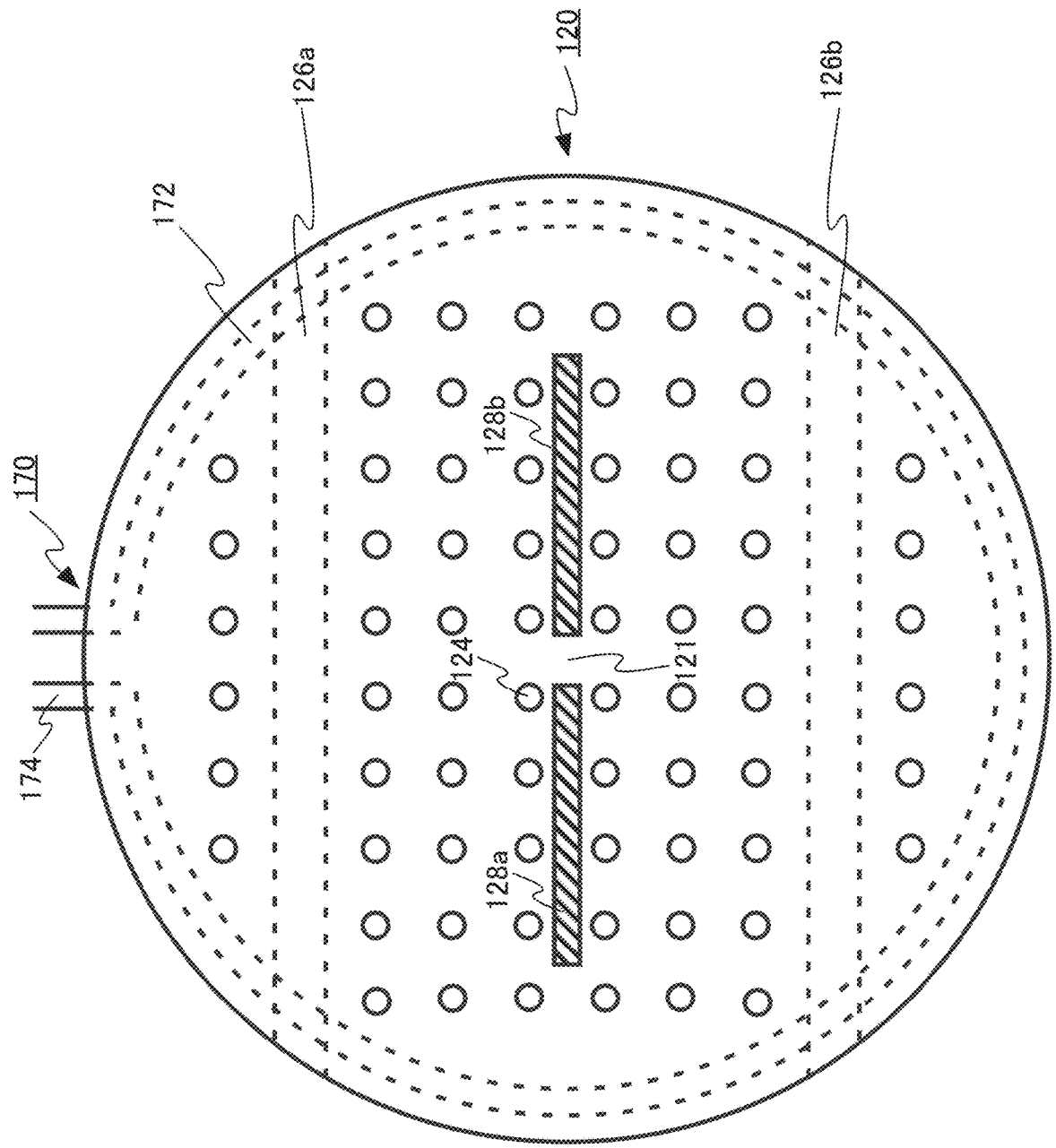
FIG. 8 is a bottom view schematically illustrating a shower plate and an outer circumferential portion cooler of the vapor phase growth apparatus according to the second embodiment.

FIG. 7 is a diagram schematically illustrating a main portion of a vapor phase growth apparatus according to this embodiment. FIG. 8 is a bottom view schematically illustrating a shower plate and an outer circumferential portion cooler of the vapor phase growth apparatus according to this embodiment.

The first transparent member 128 (128a and 128b) is provided between the longitudinal flow path 124e and the longitudinal flow path 124f. The second transparent member 130 is provided in the top plate 102.

A measuring instrument 50 is provided on the top plate 102. The measuring instrument 50 is, for example, an instrument that measures the warping of the wafer W using a laser, a device that measures the thickness or quality of a film grown on the wafer W using a laser, or a radiation thermometer that measures the temperature of the wafer W using radiation from the wafer W. The first transparent member 128 and the second transparent member 130 pass through the shower plate 120 and the top plate 102, respectively, in order to effectively irradiate the wafer W with laser beams and detect reflected laser beams, or to effectively detect the radiation. The second transparent member 130 is disposed right above the first transparent member 128 and the measuring instrument 50 is disposed right on the second transparent member 130.

The first transparent member 128 and the second transparent member 130 are sufficiently transparent with respect to a predetermined wavelength used in the measuring instrument 50 and are preferably, for example, quartz glass. Any member may be used as long as it has sufficiently strength, is sufficiently transparent with respect to a predetermined wavelength, and has high resistance to, for example, process gas. For example, sapphire can be preferably used.

In FIG. 8, the first transparent members 128a and 128b have a rectangular shape in which a long side is parallel to the direction of the lateral cooling flow path 126 in which the first cooling medium flows. However, the first transparent members 128a and 128b may have a rectangular shape in which a long side is perpendicular to the flow direction of the first cooling medium.

Figure 9:
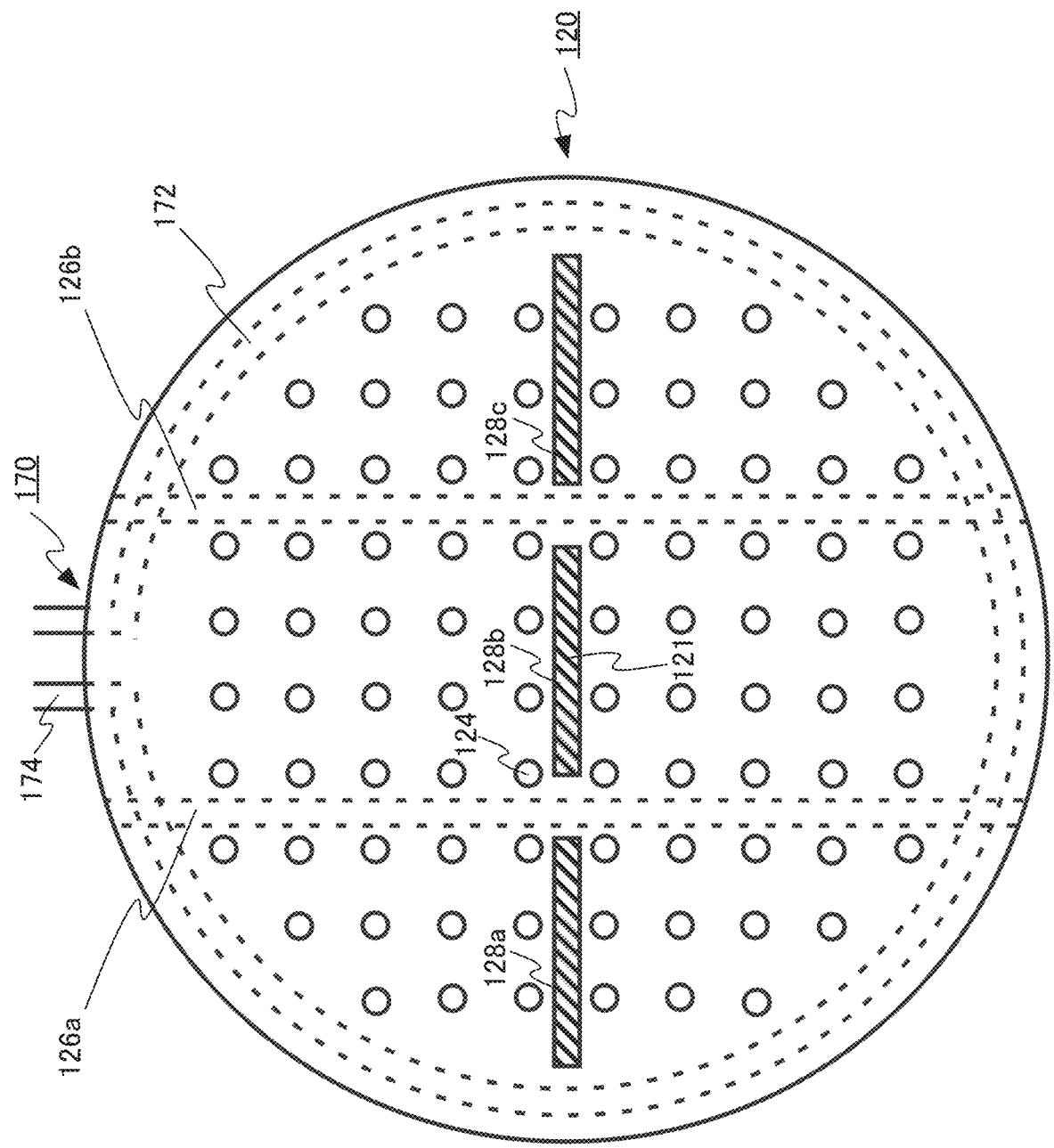
FIG. 9 is a bottom view schematically illustrating a shower plate and an outer circumferential portion cooler of a vapor phase growth apparatus according to another aspect of the second embodiment.

FIG. 9 is a bottom view schematically illustrating a shower plate and an outer circumferential portion cooler of a vapor phase growth apparatus according to another aspect of this embodiment. First transparent members 128a, 128b and 128c may have a rectangular shape in which a long side is perpendicular to the flow direction of the first cooling medium.

Figure 10:
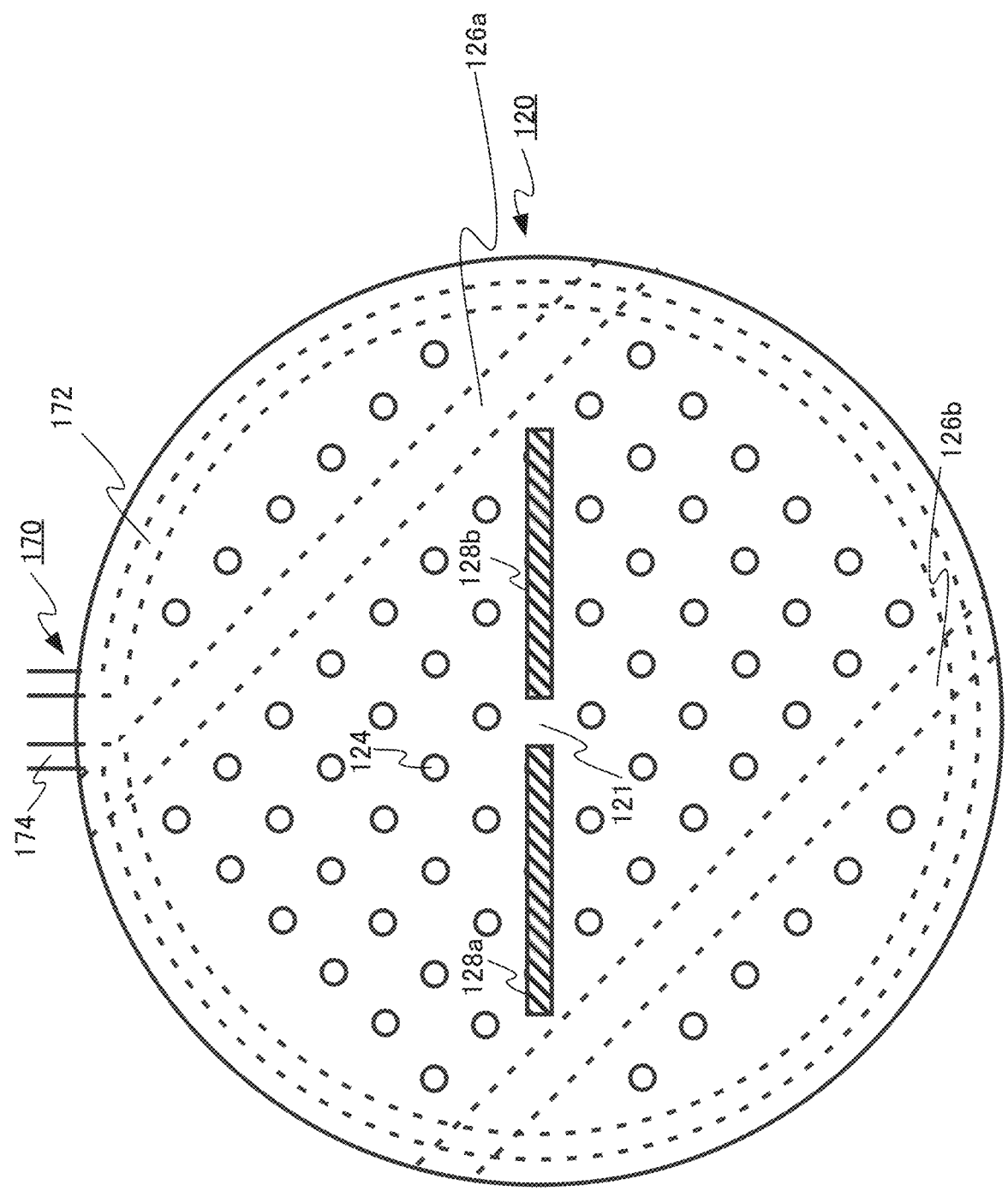
FIG. 10 is a bottom view schematically illustrating a shower plate and an outer circumferential portion cooler of a vapor phase growth apparatus according to another aspect of the second embodiment.

FIG. 10 is a bottom view schematically illustrating a shower plate and an outer circumferential portion cooler of a vapor phase growth apparatus according to another aspect of this embodiment. The longitudinal flow paths 124 may be arranged such that the outlets of the longitudinal flow paths 124 are parallel to a long side of the first transparent member 128, as illustrated in FIGS. 8 and 9, or may be arranged such that the outlets of the longitudinal flow paths 124 are inclined at 45 degrees with respect to a long side of the first transparent member 128, as illustrated in FIG. 10.

According to the shower head, the vapor phase growth apparatus, and the vapor phase growth method of this embodiment, it is possible to form a film with a uniform thickness, similarly to the first embodiment. In addition, according to the shower head, the vapor phase growth apparatus, and the vapor phase growth method of this embodiment, it is possible to observe the state of the wafer W while a film is being formed. Therefore, the controllability of the temperature or warping of the wafer W while a film is being formed is improved.

Third Embodiment

A shower head according to this embodiment differs from the shower head according to the second embodiment in that the longitudinal flow path 124 is provided in the first transparent member 128. Here, the description of the same components as those in the second embodiment will not be repeated.

Figure 11:
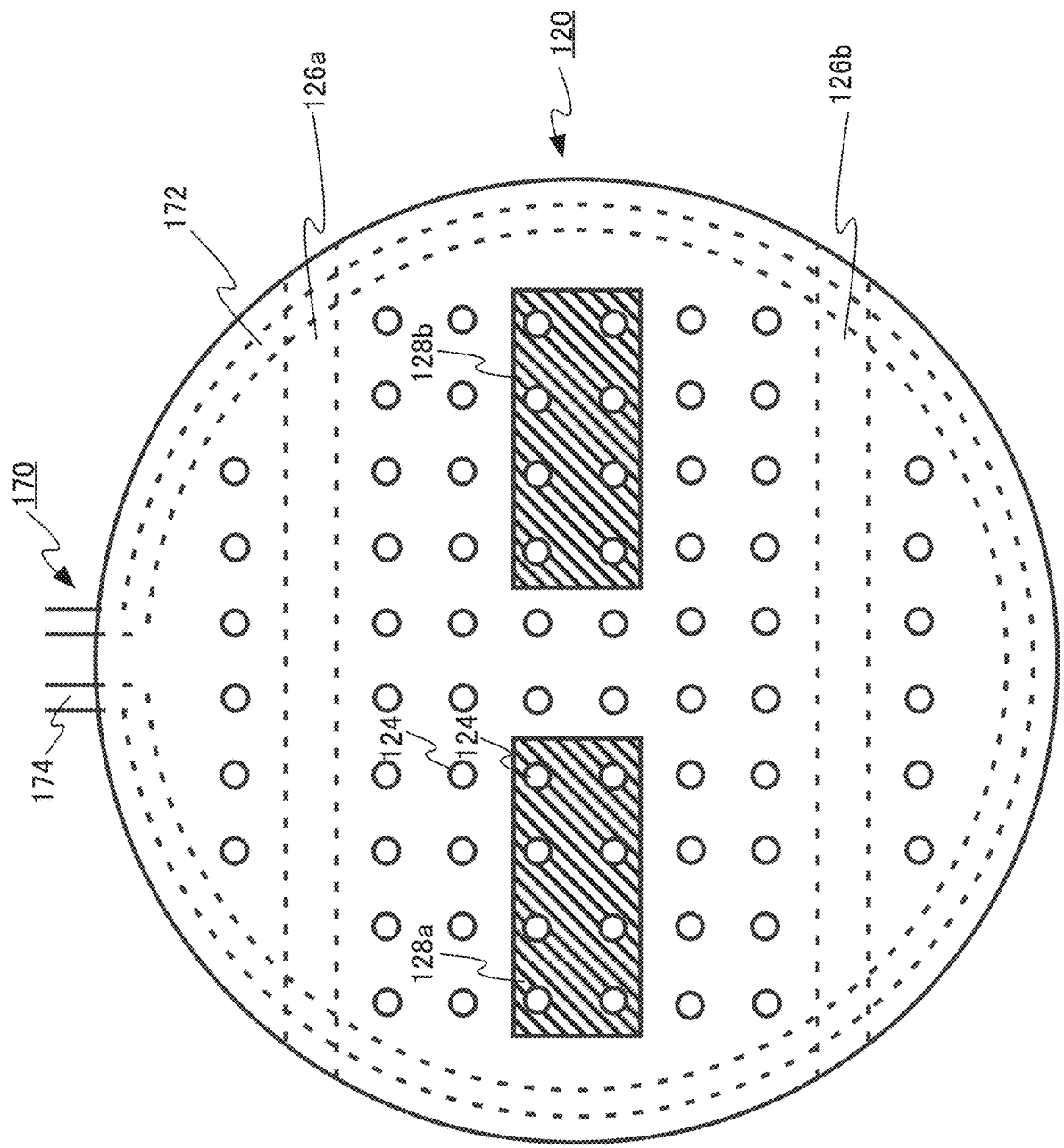
FIG. 11 is a bottom view schematically illustrating a shower plate and an outer circumferential portion cooler of a vapor phase growth apparatus according to a third embodiment.

FIG. 11 is a bottom view schematically illustrating a shower plate and an outer circumferential portion cooler of a vapor phase growth apparatus according to this embodiment. If the longitudinal flow path 124 is provided in the first transparent member 128, it is possible to use a large transparent member. Therefore, for example, it is possible to measure temperature at a large number of positions on the surface of the wafer W, using a large number of radiation thermometers. In addition, it is possible to measure the warping of the wafer W in detail, using, for example, a device that measures the warping of the wafer W at a large number of positions. As a result, the controllability of the temperature or warping of the wafer W while a film is being formed is improved.

According to the shower head, the vapor phase growth apparatus, and the vapor phase growth method of this embodiment, it is possible to form a film with a uniform thickness, similarly to the first embodiment. In addition, the controllability of the temperature or warping of the wafer W while a film is being formed is improved. It is possible to measure various states of the wafer W.

Fourth Embodiment

In this embodiment, the vapor phase growth apparatus according to any one of the first to third embodiments is used. However, this embodiment differs from the first to third embodiments in that the temperature of the shower head 100 (shower plate 120) varies depending on the film to be grown. Here, the description of the same components as those in the first to third embodiments will not be repeated.

Figure 12:
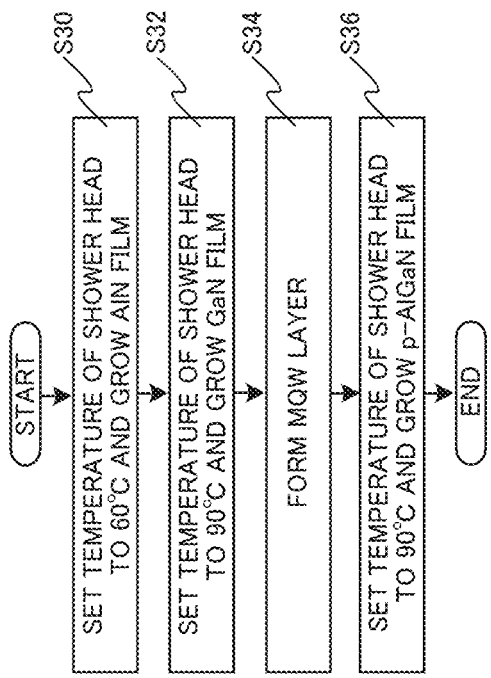
FIG. 12 is a flowchart illustrating a vapor phase growth method according to a fourth embodiment.

FIG. 12 is a flowchart illustrating a vapor phase growth method according to the fourth embodiment.

First, the wafer W is heated to a predetermined temperature and the controller 180 controls the first chiller 112 connected to the lateral cooling flow path 126 and the second chiller 114 connected to the outer circumferential portion cooling flow path 172 such that the temperature of the shower head 100 is, for example, 60° C. Then, for example, hydrogen (H$_2$), ammonia (NH$_3$), and trimethylaluminum (TMA) are supplied to grow an AlN film on the wafer W (S30).

Then, the temperature of the shower head 100 is set to 90° C. and, for example, hydrogen, ammonia, and trimethylgallium (TMG) are supplied to form a GaN film on the wafer W (S32).

Then, a multiple quantum well (MQW) layer is formed on the GaN film (S34). Then, the temperature of the shower head 100 is set to 90° C. and, for example, hydrogen, ammonia, TMG, TMA, and Cp$_2$Mg (bis(cyclopentadienyl) magnesium) are supplied to grow a p-AlGaN film doped with Mg (S36).

As such, since the temperature of the shower head 100 varies depending on the film to be formed, it is possible to obtain a film with high crystallinity at a high growth speed.

In this embodiment, when an AlN film is formed, the temperature of the shower head 100 is 60° C. However, the temperature of the shower head 100 is preferably equal to or greater than 40° C. and equal to or less than 80° C. and more preferably equal to or greater than 50° C. and is equal to or less than 70° C.

In addition, when a GaN film and a p-AlGaN film are formed, the temperature of the shower head 100 is 90° C. However, when a film including Ga or Mg other than a simple AlN film is formed, the temperature of the shower head 100 is preferably equal to or greater than 70° C. and equal to or less than 130° C., which is higher than that when the AlN film is formed. The temperature of the shower head 100 is more preferably equal to or greater than 80° C. and equal to or less than 90° C.

The vapor phase growth method according to this embodiment does not necessarily use the vapor phase growth apparatus according to any one of the first to third embodiments and the invention is not limited thereto.

In the above-described embodiments, for example, portions which are not necessary to describe the invention, such as structures, are not described. However, for example, necessary structures can be appropriately selected and used. In addition, the shower heads, the vapor phase growth apparatuses, and the vapor phase growth methods which include the components according to the invention and whose design can be appropriately changed by those skilled in the art are included in the scope of the invention. The scope of the invention is defined by the scope of the claims and the scope of equivalents thereof.

What is claimed is:

1. A vapor phase growth method comprising:
   mixing a plurality of process gases;
   supplying a mixed gas of the process gases to a plurality of longitudinal flow paths provided in a shower plate;
   controlling a temperature of the shower plate using a lateral cooling flow path provided between the longitudinal flow paths and an outer circumferential portion cooling flow path provided around the shower plate, such that a difference between the temperature of an outermost circumferential portion and the temperature of a central portion of the shower plate is equal to or less than 5° C., a cooling medium flowing through the lateral cooling flow path;
   supplying the process gases from the longitudinal flow paths to a reaction chamber; and
   growing a film on a substrate put into the reaction chamber using the process gases.

2. The vapor phase growth method according to claim 1, wherein the temperature of the shower plate is changed depending on the film to be grown.

3. The vapor phase growth method according to claim 1, wherein, when the film is an AlN film, the temperature of the shower plate is less than the temperature of the shower plate when the film including Ga or Mg is grown.

4. The vapor phase growth method according to claim 1, wherein, when the film is the AlN film, the temperature of the shower plate is equal to or greater than 50° C. and equal to or less than 70° C., and
when the film includes Ga or Mg, the temperature of the shower plate is equal to or greater than 80° C. and equal to or less than 90° C.

5. The vapor phase growth method according to claim 1, wherein a diameter a of the lateral cooling flow path, a diameter d of the longitudinal flow path, and a gap t between the longitudinal flow paths satisfy t<a<d+2t in a plane perpendicular to a flow direction of the cooling medium.

6. The vapor phase growth method according to claim 1, wherein a diameter d of the longitudinal flow path, and a gap t between the longitudinal flow paths define a width, d+2t, between the longitudinal flow paths provided adjacent to the lateral cooling flow path as being in the plane perpendicular to the flow direction of the first cooling medium.

7. The vapor phase growth method according to claim 1, wherein the lateral cooling flow path is separately disposed from a center of the shower plate.

8. The vapor phase growth method according to claim 1, wherein the shower plate further includes a first transparent member provided between at least two of the longitudinal flow paths.

9. The vapor phase growth method according to claim 8, wherein some of the longitudinal flow paths are provided in the first transparent member.

10. The vapor phase growth method according to claim 9, wherein a diameter a of the lateral cooling flow path, a diameter d of each of the longitudinal flow paths, and a gap t between the longitudinal flow paths satisfy t<a<d+2t in a plane perpendicular to a flow direction of the cooling medium.

11. The vapor phase growth method according to claim 8, wherein a measuring instrument is optically accessible to the substrate through the first transparent member and a second transparent member provided above the first transparent member.

* * * * *